United States Patent
Basker et al.

(10) Patent No.: US 9,018,052 B2
(45) Date of Patent: Apr. 28, 2015

(54) INTEGRATED CIRCUIT INCLUDING DRAM AND SRAM/LOGIC

(71) Applicant: International Business Machines Corporation, Armonk, NY (US)

(72) Inventors: Veeraraghavan S. Basker, Schenectady, NY (US); Kangguo Cheng, Schenectady, NY (US); Bruce B. Doris, Brewster, NY (US); Terence B. Hook, Jericho Center, VT (US); Ali Khakifirooz, Albany, NY (US); Pranita Kerber, Mount Kisco, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/525,559

(22) Filed: Oct. 28, 2014

(65) Prior Publication Data

US 2015/0064853 A1 Mar. 5, 2015

Related U.S. Application Data

(60) Division of application No. 13/551,714, filed on Jul. 18, 2012, which is a continuation-in-part of application No. 13/344,885, filed on Jan. 6, 2012, now Pat. No. 8,653,596.

(51) Int. Cl.
*H01L 21/00* (2006.01)
*H01L 21/84* (2006.01)
(Continued)

(52) U.S. Cl.
CPC .......... *H01L 21/84* (2013.01); *H01L 27/10861* (2013.01); *H01L 27/10873* (2013.01); *H01L 27/10894* (2013.01); *H01L 27/1116* (2013.01)

(58) Field of Classification Search
USPC ................... 438/149, 151, 153–155, 243, 479
See application file for complete search history.

(56) References Cited

U.S. PATENT DOCUMENTS

| | | |
|---|---|---|
| 5,504,033 A | 4/1996 | Bajor et al. |
| 6,048,763 A | 4/2000 | Doan et al. |

(Continued)

OTHER PUBLICATIONS

IP.com (Disclosed Anonymously), "Simultaneously forming deep trench isolation and deep trench capacitor on the same chip," IPCOM000198808D, IP.com electronic Publication, Aug. 17, 2010, pp. 1-4.

(Continued)

*Primary Examiner* — Thien F Tran
(74) *Attorney, Agent, or Firm* — Cantor Colburn LLP; Vazken Alexanian

(57) ABSTRACT

An integrated circuit comprising an N+ type layer, a buffer layer arranged on the N+ type layer; a P type region formed on with the buffer layer; an insulator layer overlying the N+ type layer, a silicon layer overlying the insulator layer, an embedded RAM FET formed in the silicon layer and connected with a conductive node of a trench capacitor that extends into the N+ type layer, the N+ type layer forming a plate electrode of the trench capacitor, a first contact through the silicon layer and the insulating layer and electrically connecting to the N+ type layer, a first logic RAM FET formed in the silicon layer above the P type region, the P type region functional as a P-type back gate of the first logic RAM FET, and a second contact through the silicon layer and the insulating layer and electrically connecting to the P type region.

9 Claims, 10 Drawing Sheets

(51) Int. Cl.
    *H01L 27/108* (2006.01)
    *H01L 27/11* (2006.01)

(56) References Cited

U.S. PATENT DOCUMENTS

| | | | |
|---|---|---|---|
| 6,133,610 A | 10/2000 | Bolam et al. |
| 6,133,619 A | 10/2000 | Sahota et al. |
| 6,238,967 B1 | 5/2001 | Shiho et al. |
| 6,271,142 B1 | 8/2001 | Gruening et al. |
| 6,303,413 B1 | 10/2001 | Kalnitsky et al. |
| 6,440,794 B1 | 8/2002 | Kim |
| 6,529,399 B1 | 3/2003 | Namekawa et al. |
| 6,653,182 B2 | 11/2003 | Marty et al. |
| 6,667,226 B2 | 12/2003 | Pinto et al. |
| 6,724,046 B2 | 4/2004 | Oyamatsu |
| 6,727,539 B2 | 4/2004 | Divakaruni et al. |
| 6,808,981 B2 | 10/2004 | Mandelman et al. |
| 6,812,527 B2 | 11/2004 | Dennard et al. |
| 6,838,724 B2 | 1/2005 | Kowalski et al. |
| 6,844,247 B2 | 1/2005 | Inaba |
| 6,861,374 B2 | 3/2005 | Oyamatsu |
| 6,885,080 B2 | 4/2005 | Chen et al. |
| 6,963,113 B2 | 11/2005 | Ang et al. |
| 6,992,343 B2 | 1/2006 | Miyatake et al. |
| 7,078,324 B2 | 7/2006 | Dudek et al. |
| 7,098,146 B2 | 8/2006 | Oyamatsu |
| 7,129,559 B2 | 10/2006 | Wu et al. |
| 7,384,829 B2 | 6/2008 | Cheng et al. |
| 7,439,603 B2 | 10/2008 | Jung et al. |
| 7,479,418 B2 | 1/2009 | Cai et al. |
| 7,592,209 B2 | 9/2009 | Chang |
| 7,713,814 B2 | 5/2010 | Cheng et al. |
| 7,759,714 B2 | 7/2010 | Itoh et al. |
| 7,973,364 B2 | 7/2011 | Krivokapic |
| 7,985,633 B2 | 7/2011 | Cai et al. |
| 7,986,006 B2 | 7/2011 | Orlowski et al. |
| 8,193,067 B2 | 6/2012 | Anderson et al. |
| 8,470,684 B2 | 6/2013 | Pei et al. |
| 8,525,292 B2 | 9/2013 | Cheng et al. |
| 8,653,596 B2 | 2/2014 | Cheng et al. |
| 2005/0118789 A1 | 6/2005 | Aga et al. |
| 2007/0057302 A1 | 3/2007 | Ho et al. |
| 2009/0108314 A1 | 4/2009 | Cai et al. |
| 2009/0173980 A1 | 7/2009 | Cheng et al. |
| 2011/0193193 A1 | 8/2011 | Dube et al. |
| 2011/0272762 A1 | 11/2011 | Booth, Jr. et al. |
| 2013/0241034 A1 | 9/2013 | Cheng et al. |

OTHER PUBLICATIONS

Kawahara "Low-voltage embedded RAMs in the nanometer era", IEEE Trans. Electron. vol. E90-C, No. 4, Apr. 2007; pp. 333-338.

R.E. Burger, et al., "Process for Simultaneously Forming Poly/EPI Silicon Filled Deep and Shallow Isolation Trenches Having a CVD Oxide Cap," IBM Technical Disclosure Bulletin, IP.Com, IPCOM000102683D, vol. 33, No. 7, Dec. 1990, pp. 388-392.

S. S. Iyer et al., "45-nm silicon-on-insulator CMOS technology integrating embedded DRAM for high-performance server and ASIC applications," IBM J. Res. & Dev., vol. 55, No. 3, Paper 5, May/Jun. 2011, pp. 1-14.

INTEGRATED CIRCUIT INCLUDING DRAM AND SRAM/LOGIC

DOMESTIC PRIORITY

This application is a divisional of U.S. patent application Ser. No. 13/551,714, filed Jul. 18, 2012, which is a continuation-in-part application of application Ser. No. 13/344,885, filed Jan. 6, 2012, now U.S. Pat. No. 8,653,596, the contents of which in its entirety are herein incorporated by reference.

BACKGROUND

The exemplary embodiments of this invention relate generally to semiconductor devices and fabrication techniques and, more specifically, relate to the fabrication of semiconductor transistor devices, such as those used in random access memory (RAM) and logic circuitry, using a silicon on insulator (SOI) substrate such as an extremely thin SOI (ETSOI) substrate.

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX. For a single BOX SOI wafer the thin silicon layer is divided into active regions by shallow trench isolation (STI) which intersects the BOX and provides a total isolation for active device regions formed in the silicon layer. Sources and drains of field effect transistors (FETs) are formed, for example, by ion implantation of N-type and/or P-type dopant material into the thin silicon layer with a channel region between the source and drain using the gate pattern to self-define the channel region. Prior to the formation of sources and drains gates can be formed on top of the channel region, for example, by deposition of a gate dielectric and conductor on the top surface of the thin silicon, followed by photolithographic patterning and etching. Back gates can also be formed under the active region on a single BOX SOI wafer using the BOX layer as the back gate dielectric. The back gates can be defined by, for example, either P+ or N+ implantation.

Transistors having back gates typically use relatively thin silicon and BOX layers to enable fully depleted device operation with a threshold voltage which is responsive to the back gate. Such FETs built in thin SOI technology with back gates can exhibit significant advantages such as, for example, reduced short channel effects, less threshold variability due to body doping fluctuations, and an ability to use the back gate voltage to adjust the threshold.

An embedded dynamic random access memory (eDRAM)) is a dynamic random access memory (dynamic or power-refreshed RAM) that includes some amount of static RAM (SRAM), where at least some memory accesses will be to the faster SRAM.

SUMMARY

The exemplary embodiments of this invention provide in a first aspect thereof an integrated circuit that comprises field effect transistors (FETs) at least some of which comprise a part of random access memory (RAM) and logic devices. The integrated circuit includes an N+ type layer; a buffer layer arranged on and in contact with the N+ type layer; a P type region formed on and in contact with the buffer layer; an insulator layer overlying the N+ type layer; a silicon layer overlying the insulator layer; a dynamic RAM FET formed in the silicon layer and connected with a conductive node of a trench capacitor that extends into the N+ type layer, the N+ type layer forming a plate electrode of the trench capacitor; a first contact through the silicon layer and the insulating layer and electrically connecting to the N+ type layer; a first logic/static RAM FET formed in the silicon layer above the P type region, the P type region functional as a P-type back gate of the first logic/static RAM FET; and a second contact through the silicon layer and the insulating layer and electrically connecting to the P type region.

The exemplary embodiments of this invention provide in a further aspect thereof a method to fabricate an integrated circuit comprising field effect transistors (FETs) at least some of which comprise a part of random access memory (RAM) and logic devices. The method includes providing a substrate having an N+ type layer; forming a buffer layer on a portion of the N+ layer, forming a P type region on the buffer layer, the P type layer having a thickness that is disposed within the N+ type layer; forming an insulator layer overlying the N+ type layer having a silicon layer overlying the insulator layer; forming a first deep trench isolation structure extending through the silicon layer, the insulating layer and into the N+ type layer to a depth that is greater than a depth at which the P type layer is disposed, the first deep trench isolation structure abutting a first edge of the P type layer; forming a dynamic RAM FET in the silicon layer connected with a conductive node of a trench capacitor that is formed to extend into the N+ type layer, the N+ type layer being a plate electrode of the trench capacitor, forming a first logic/static RAM FET in the silicon layer above the P type region, the P type region functional as a P-type back gate of the first logic/static RAM FET; and forming a first contact through the silicon layer and the insulating layer to electrically connect to the N+ type layer and a second contact through the silicon layer and the insulating layer to electrically connect to the P type region.

The exemplary embodiments of this invention provide in another aspect thereof a method to fabricate an integrated circuit comprising field effect transistors (FETs) at least some of which comprise a part of random access memory (RAM) and logic devices. This method comprises providing a substrate having an N+ type layer; forming a buffer layer on the N+ type layer, forming a P type region on the buffer layer, the P type layer having a thickness that is disposed within the N+ type layer; forming an insulator layer overlying the N+ type layer having a silicon layer overlying the insulator layer; forming a first deep trench isolation structure extending through the silicon layer, the insulating layer and into the N+ type layer to a depth that is greater than a depth at which the P type layer is disposed. The first deep trench isolation structure abuts a first edge of the P type layer. The method further includes forming a second deep trench isolation structure extending through the silicon layer, the insulating layer and into the N+ type layer to a depth that is greater than a depth at which the P type layer is disposed. The second deep trench isolation structure abuts a second edge of the P type layer opposite the first edge. The method further includes forming an N or N+ type region in the P type region as an N or N+ type layer having a thickness and disposed adjacent to and abutting the second deep trench isolation structure; forming a dynamic RAM FET in the silicon layer connected with a conductive node of a trench capacitor that is formed to extend into the N+ type layer, the N+ type layer being a plate electrode of the trench capacitor, forming a first logic/static RAM FET in the silicon layer above the P type region, the P type region functional as a P-type back gate of the first logic/static RAM FET, and forming a second logic/static RAM FET in the silicon layer above the N or N+ type region, the N or N+ type region functional as an N-type back gate of the second logic/static RAM FET. The method further includes forming a first contact through the silicon layer and the insulating layer to electrically connect to the N+ type layer, a second contact through the silicon layer and the insulating layer to electrically connect to the P type region, and a third contact through the silicon layer and the insulating layer and electrically connecting to the N or N+ type region.

BRIEF DESCRIPTION OF THE SEVERAL VIEWS OF THE DRAWINGS

FIG. 1 is an enlarged cross-sectional view of a structure having a semiconductor substrate and an N+ semiconductor layer;

FIG. 2 shows the structure of FIG. 1 after application of a mask 14 to what will become an eDRAM portion of the structure and the formation of a P-doped semiconductor region (and the formation of an optional intrinsic (undoped) layer beneath the P-doped region) in what will become a logic/SRAM portion of the structure, where the P-doped region will function as a back gate for the logic/SRAM circuit;

FIG. 3 shows the structure of FIG. 2 after the mask is removed and after formation of a BOX layer and an overlying SOI layer;

FIG. 4 shows the structure of FIG. 3 after an eDRAM deep trench capacitor is formed and after shallow and deep trench isolation regions are formed; and FIG. 5 shows the structure of FIG. 4 after the formation of logic/SRAM nFET and pFET devices, the eDRAM device, and contacts to the P back gate and to an electrode of the deep trench capacitor.

FIG. 6 is an enlarged cross-sectional view of a structure having a semiconductor substrate and an N+ semiconductor layer as in FIG. 1;

FIG. 7 shows the structure of FIG. 6 after application of a hard mask over what will become the eDRAM portion of the structure, followed by removal of a portion of the N+ layer 12 to form a recessed region;

FIG. 8 shows the structure of FIG. 7 after forming the P back gate by epitaxial growth within the recessed region and the formation of an optional intrinsic (undoped) layer beneath the P back gate;

FIG. 9 shows the structure of FIG. 8 after removal of the hard mask, wafer bonding to provide the BOX and SOI, the formation of another mask and an N-type implant to form an N or an N+ back gate region, and the formation of the deep trench capacitor and shallow and deep trench isolation regions; and FIG. 10 shows the structure of FIG. 9 after the formation of logic/SRAM nFET and pFET devices, the eDRAM device, and contacts to the P back gate, the N or N+ back gate and to an electrode of the deep trench capacitor.

FIG. 11 is an enlarged cross-sectional view of a structure having a semiconductor substrate and an N+ semiconductor layer as in FIG. 1;

FIG. 12 shows the structure of FIG. 11 after application of a hard mask over what will become the eDRAM portion of the structure, followed by removal of a portion of the N+ layer 12 to form a recessed region;

FIG. 13 shows the structure of FIG. 12 after forming the P back gate by epitaxial growth within the recessed region and the formation of an optional intrinsic (undoped) layer beneath the P back gate;

FIG. 14 shows the structure of FIG. 13 after removal of the hard mask, wafer bonding to provide the BOX and SOI, the formation of another mask and an N-type implant to form an N or an N+ back gate region, and the formation of the deep trench capacitor and shallow and deep trench isolation regions; and FIG. 15 shows the structure of FIG. 14 after the formation of logic/SRAM nFET and pFET devices, the eDRAM device, and contacts to the P back gate, the N or N+ back gate and to an electrode of the deep trench capacitor.

DETAILED DESCRIPTION

The use of SOI, such as ETSOI, with an eDRAM having an N+ substrate below the BOX can simplify eDRAM fabrication. The N+ substrate functions as an electrode of a trench capacitor and is typically grounded. However, the grounded N+ substrate prevents the flexibility of providing back bias of ETSOI devices.

The exemplary embodiments of this invention provide methods for fabricating an integrated circuit comprising eDRAM and ETSOI logic/SRAM with back bias. The exemplary embodiments also provide circuits that are fabricated using the methods.

As will be made apparent below the embodiments of this invention provide an integrated circuit that includes an SOI substrate that include a unitary N+ layer below the BOX, a P region in the N+ layer, an SOI eDRAM with an N+ plate, and logic/SRAM devices above the P region, where the P region functions as a back gate of the logic/SRAM devices. An (optional) intrinsic (undoped) layer can be formed between the P back gate layer and the N+ layer to reduce the junction field and lower the junction leakage between the P back gate and the N+ layer. In another embodiment an N or N+ back gate can be formed in the P region. The N+ back gate functions as a second back gate of the logic/SRAM devices. The N+ plate of the SOI eDRAM, the P back gate, and the N+ back gate can be electrically biased at the same or different voltage potentials.

Reference is made first to FIGS. 1-5 for describing a process flow in accordance with a first embodiment of this invention. In FIGS. 1-5 the various layer thicknesses and feature dimensions are not drawn to scale.

Figure 1:
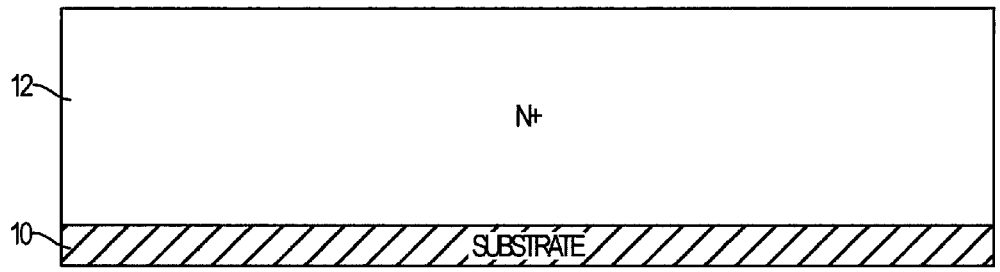
FIGS. 1-5 illustrate a process flow in accordance with a first embodiment of this invention, where.

FIG. 1 is an enlarged cross-sectional view of a structure having a semiconductor substrate 10 of any desired thickness. The substrate 10 could be a Si substrate. An N+ semiconductor layer 12 is formed in or to overlie an upper portion of the substrate 10. The N+ semiconductor layer 12 can have a dopant concentration (e.g., an arsenic or phosphorus concentration) on the order of about $10^{20}$ atoms/cm3. The N+ semiconductor layer 12 could be formed by, as non-limiting examples, epitaxial growth of an in situ N+ doped Si layer, or by deposition of Si followed by a doping technique such as implantation, solid phase diffusion or gas phase diffusion, as three non-limiting examples of doping techniques.

Figure 2:
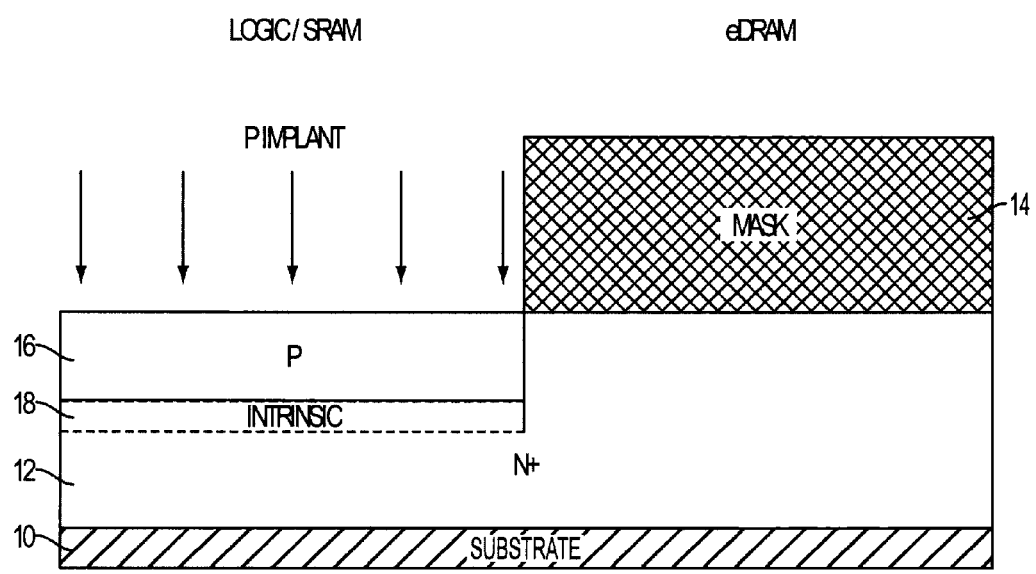

FIG. 2 shows the structure of FIG. 1 after application of a mask 14 to what will become an eDRAM portion of the structure, and the formation of a P-doped semiconductor region 16 in what will become the logic/SRAM portion of the structure. The P region 16 will function as a back gate for the logic/SRAM circuit and can have a dopant concentration (e.g., a Boron (B) or Difluoroborane (BF2) or an Indium (In) concentration) on the order of about 1018 atoms/cm3, such as a dopant concentration of about 5×1018 atoms/cm3. The P region 16 could be formed by implantation, solid phase diffusion or gas phase diffusion, as three non-limiting examples. A thickness of the P region 16 can be at least about 200 nm. An optional intrinsic region 18 can be formed beneath the P region 16, such as by the epitaxial growth of undoped Si or SiGe. If present the intrinsic region 18 can have a thickness in a range of about 15 nm to about 30 nm, with about 20 nm being a suitable value. The presence of the optional intrinsic region serves to reduce the junction field and leakage. The optional intrinsic region 18 can be viewed as a substantially intrinsic region, or as at least a region that is not intentionally doped.

Figure 3:
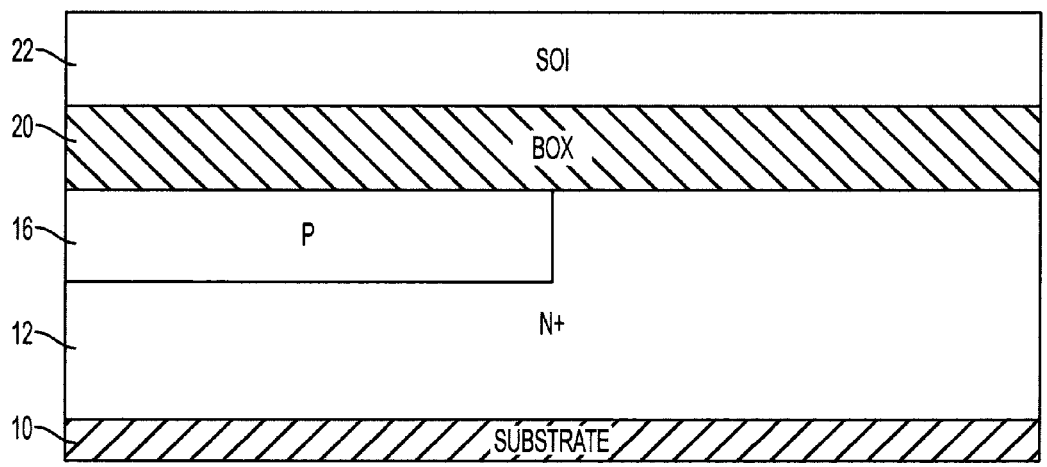

FIG. 3 shows the structure of FIG. 2 after the mask 14 is removed and after formation of a BOX layer 20 and an overlying SOI layer 22. The BOX layer 20 and the overlying SOI layer 22 can be formed by wafer bonding to the existing structure shown in FIG. 2. The wafer bonding process can be performed by any conventional process, such as by depositing a SiO2 layer on a Si substrate, inverting the structure and placing the SiO2 layer over the N+ layer 12 to form the BOX 20, and subsequently thinning the Si layer to a desired thickness to form the SOI layer 22. As non-limiting examples the BOX layer 20 can have a thickness in a range of about 10 nm to about 50 nm, and the SOI layer 22 can have a thickness in a range of about 3 nm to about 15 nm (i.e., the ETSOI layer 22 may be considered to be an ETSOI layer).

It is pointed out that process step shown in FIG. 3 could be performed immediately after the process step shown in FIG. 1, and the P region (back gate) 16 can be implanted through the wafer bonded SOI 22 and BOX 20 after application of the mask 14 to what will become an eDRAM portion of the structure.

Figure 4:
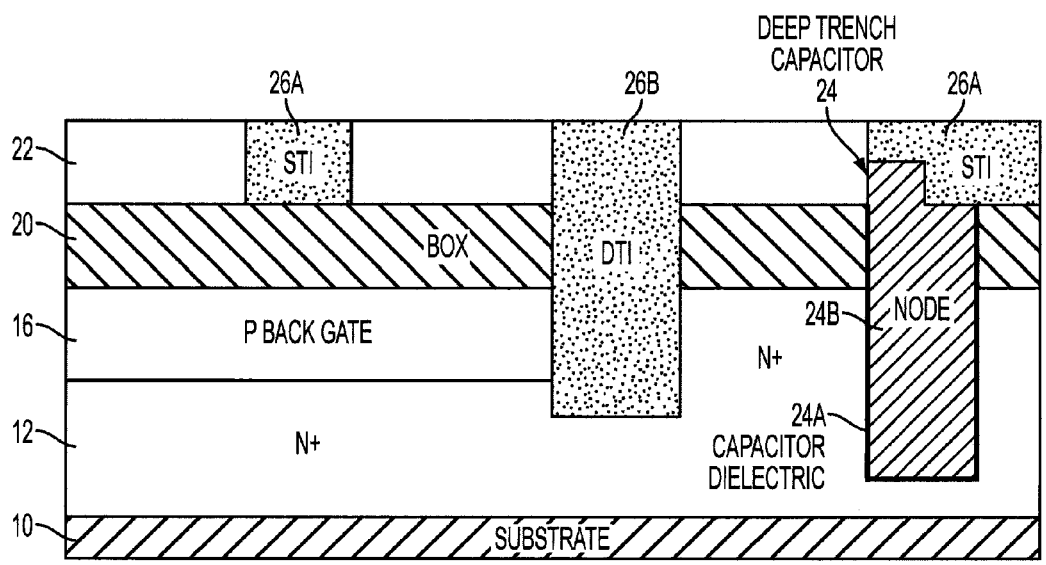

FIG. 4 shows the structure of FIG. 3 after an eDRAM deep trench capacitor 24 is formed using any conventional method and after trench isolation regions are formed. The deep trench capacitor 24 can be formed by masking and performing a multi-step etching process on the SOI 22, the BOX 20 and N+ substrate 12 to form an opening to a desired depth in the N+ substrate. The deep trench capacitor 24 includes a capacitor dielectric liner 24A, such as a layer of SiO2, that extends through the BOX 20 and into the N+ substrate 12, as well as a conductive node 24B such as one formed from heavily doped polysilicon.

The trench isolation regions can be characterized as shallow trench isolation (STI) 26A and deep trench isolation (DTI) 26B. The STI 26A can be formed by masking and performing an etching process on the SOI 22, followed by filling the resultant openings with a dielectric such as SiO2. An STI liner comprised of a nitride (e.g., SiN) can also be formed prior to filing the opening with the SiO2. The bottom of the STI 26A is abutted to the BOX 20 to electrically isolate intervening portions of the SOI 22 from one another. Note that one STI region 26A is formed so as to cover the top portion of the conductive node 24B of the deep trench capacitor 24, leaving a portion exposed within the SOI 22. This exposed portion is subsequently electrically connected to an eDRAM device (FET) in the processing step described below with reference to FIG. 5.

The DTI 26B can be formed by masking and performing a multi-step etching process on the SOI 22, the BOX 20 and N+ substrate 12 to form an opening to a desired depth in the N+ substrate. This is followed by filling the resultant openings with a dielectric such as SiO2. A DTI liner comprised of a nitride (e.g., SiN) can also be formed prior to filing the opening with the SiO2. The DTI 26B extends to a depth in the N+ substrate 12 that is at least greater than the depth of the P region 16, i.e., at least greater than the depth of the P back gate 16, and is formed so as to abut an edge of the P back gate 16 as shown.

Figure 5:
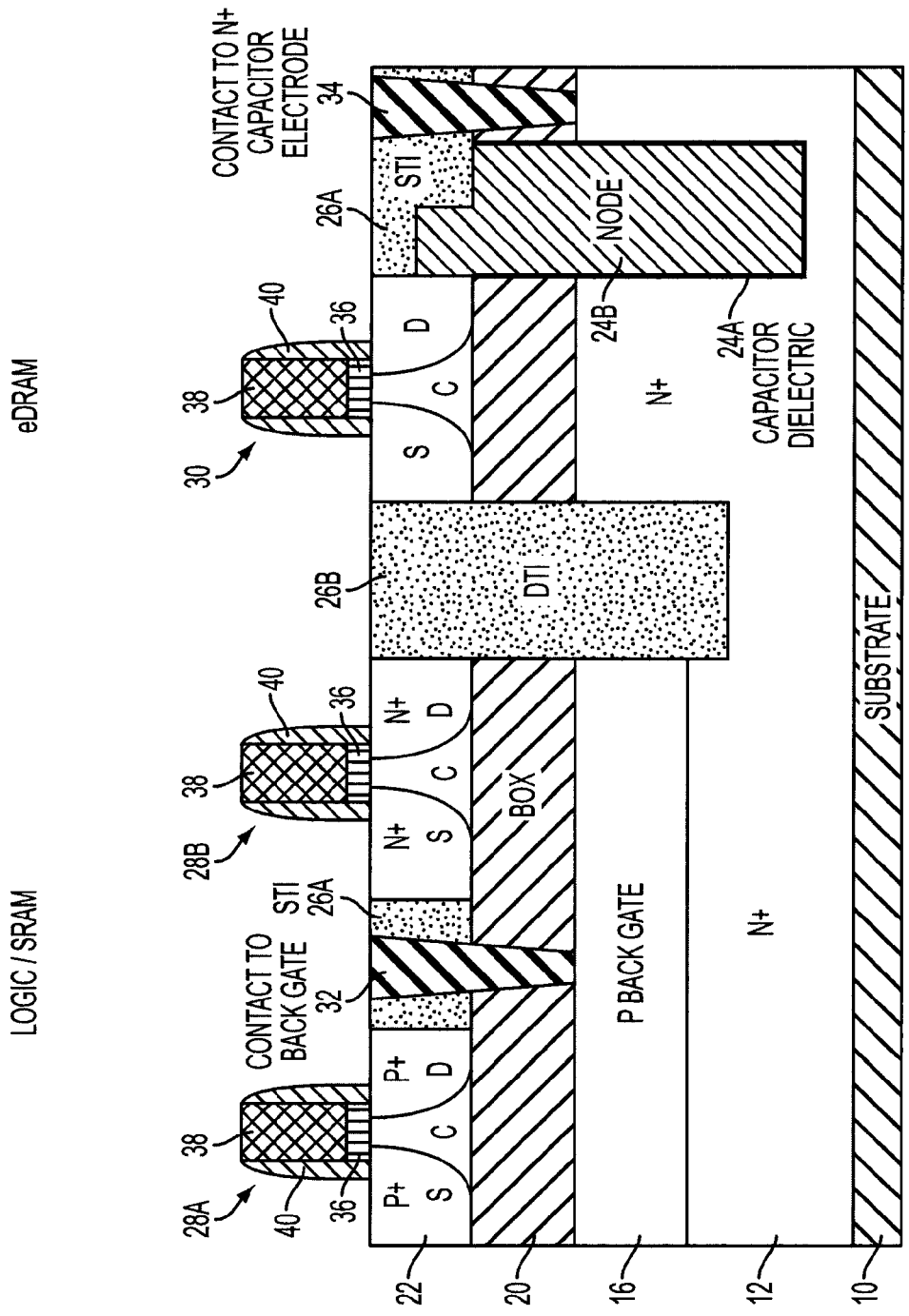

FIG. 5 shows the structure of FIG. 4 after the formation of logic/SRAM devices 28A, 28B (only two are shown), the eDRAM device 30, a contact 32 to the back gate 16 and a contact 34 to the N+ capacitor electrode. The exposed portion of the deep trench capacitor conductive node 24B can be seen to be electrically connected to the Drain (D) of the eDRAM device 30.

In this embodiment the logic/SRAM device 28A is a pFET and the logic/SRAM device 28B is an nFET. Each of the logic/SRAM devices 28A, 28B and the eDRAM device 30 can be assumed to include a gate structure comprised of a thin gate interface layer 36, an overlying gate conductor 38 and gate spacer layer 40 (e.g., a nitride). The gate interface layer 36 can be SiO2. The gate conductor 38 can be a metal or metal system. As non-limiting examples the gate conductor 38 can include a metal system selected from one or more of TiN, TiC, TaN, TaC, TaSiN, HfN, W, Al and Ru, and can be selected at least in part based on the desired work function (WF) of the device (nFET or pFET), as is known.

In other embodiments the gate conductor 38 can be conventional doped polysilicon.

The gate structure can also include a thin layer of gate dielectric (not shown) formed as a layer of oxide or nitride or from a high dielectric constant (high-k) material comprising a dielectric metal oxide and having a dielectric constant that is greater than the dielectric constant of silicon nitride of 7.5. The high-k dielectric layer may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, a silicate thereof, and an alloy thereof. Each value of x is independently from 0.5 to 3 and each value of y is independently from 0 to 2. The thickness of the high-k dielectric layer may be from 1 nm to 10 nm, and more preferably from about 1.5 nm to about 3 nm. The high-k dielectric layer can have an effective oxide thickness (EOT) on the order of, or less than, about 1 nm. The gate conductor 38 can be deposited directly on the surface of the high-k dielectric layer by, for example, chemical vapor deposition (CVD), physical vapor deposition (PVD), or atomic layer deposition (ALD).

Each FET includes a source (S) and a drain (D) between which is found the channel (C). In the pFET 28A the S/D can be doped P+ (e.g., using implanted or diffused Boron) while in the nFET 28B the S/D can be doped N+ (e.g., using implanted or diffused Arsenic).

The contact 32 is made through the STI 26A and through the underlying BOX 20 to electrically connect to the P back gate 16. The contact 32 enables the common P back gate 16 beneath the logic/SRAM devices 28 to be biased separately from the N+ substrate 12.

The contact 34 to the capacitor electrode is made through the STI 26A and through the underlying BOX 20 to electrically connect to the N+ substrate 12. During operation the contact 34 can be grounded.

The contacts 32 and 34 can use any suitable conductor. One suitable conductor is a metal such as Aluminum (Al), Copper (Cu), or Tungsten (W), as non-limiting examples.

Reference is now made to FIGS. 6-10 for describing a process flow in accordance with a second embodiment of this invention. As in FIGS. 1-5 the various layer thicknesses and feature dimensions are not drawn to scale. The embodiment in accordance with FIGS. 6-10 provides for two different types of back gates (one P and the other N or N+) beneath the logic/SRAM devices 28. The two back gates can be separately biased. Those layers and structures in FIGS. 6-10 that can be the same as in FIGS. 1-5 are numbered accordingly.

Figure 6:
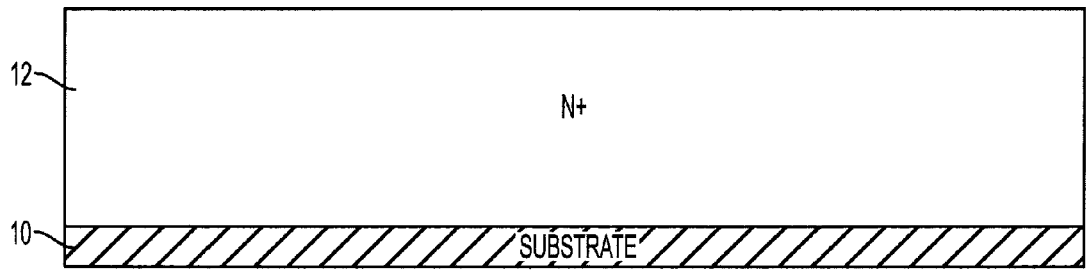
FIGS. 6-10 illustrate a process flow in accordance with a second embodiment of this invention, where.

FIG. 6 is an enlarged cross-sectional view of a structure having the semiconductor substrate 10 of any desired thickness. The substrate 10 could be a Si substrate. The N+ semiconductor layer 12 is formed in or to overlie an upper portion of the substrate 10. The N+ semiconductor layer 12 can have a dopant concentration (e.g., an As concentration) on the order of about 1020 atoms/cm3. The N+ semiconductor layer 12 could be formed by, as non-limiting examples, epitaxial growth of an in situ N+ doped Si layer, or by deposition of Si followed by a doping technique such as implantation, solid phase diffusion or gas phase diffusion, as three non-limiting examples of doping techniques.

Figure 7:
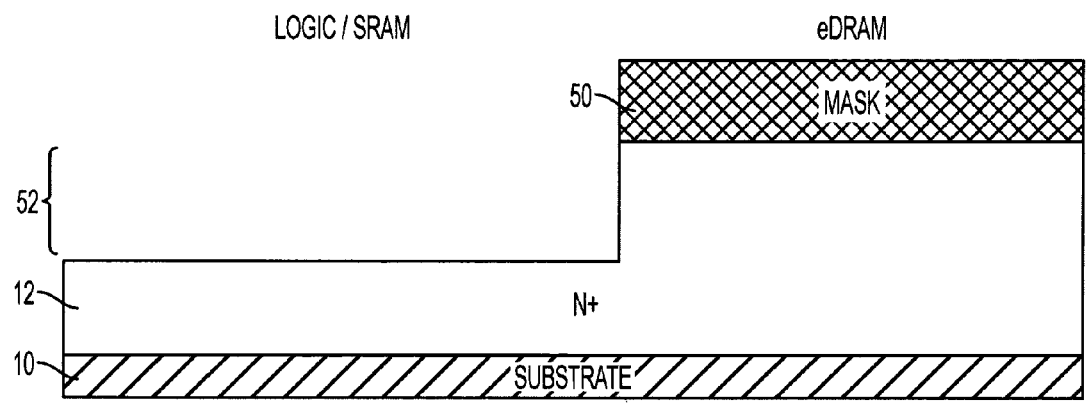

FIG. 7 shows the structure of FIG. 6 after application of a hard mask 50 over what will become the eDRAM portion of the structure, followed by removal of a portion of the N+ layer 12 to form a recessed region 52. A reactive ion etch (RIE) process is one suitable technique to form the recess 52 using an etch chemistry that is selective to Si (e.g., CF4). The depth of the recess 52 is sufficient to accommodate the thickness of the intrinsic layer (if used) and the thickness of the P back gate region (e.g., at least about 200 nm).

Figure 8:
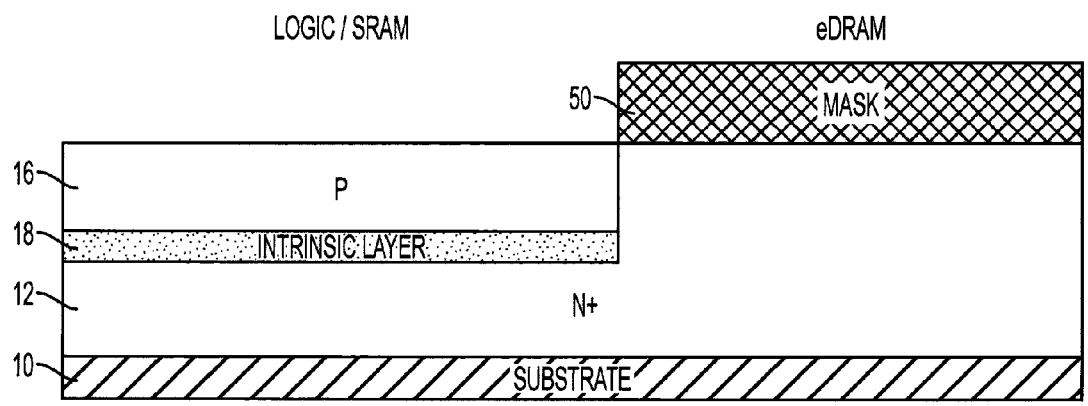

FIG. 8 shows the structure of FIG. 7 after forming the P back gate 16 by epitaxial growth within the unmasked recess 52. Optionally, the intrinsic (undoped) layer 18 can be grown before growing P-type doped layer 16. The intrinsic layer 18, if present, aids in reducing junction leakage between the P back gate 16 and N+ layer 12. As in the embodiment of FIGS. 1-5 the thickness of the P back gate layer 16 can be at least about 200 nm, and the intrinsic region 18, if present, can have a thickness in a range of about 15 nm to about 30 nm, with about 20 nm being a suitable value. As in the embodiment of FIGS. 1-5 the dopant concentration (e.g., a Boron (B) or Difluoroborane (BF2) or an Indium (In) concentration) can be on the order of about 1018 atoms/cm3, such as a dopant concentration of about 5×1018 atoms/cm3.

Figure 9:
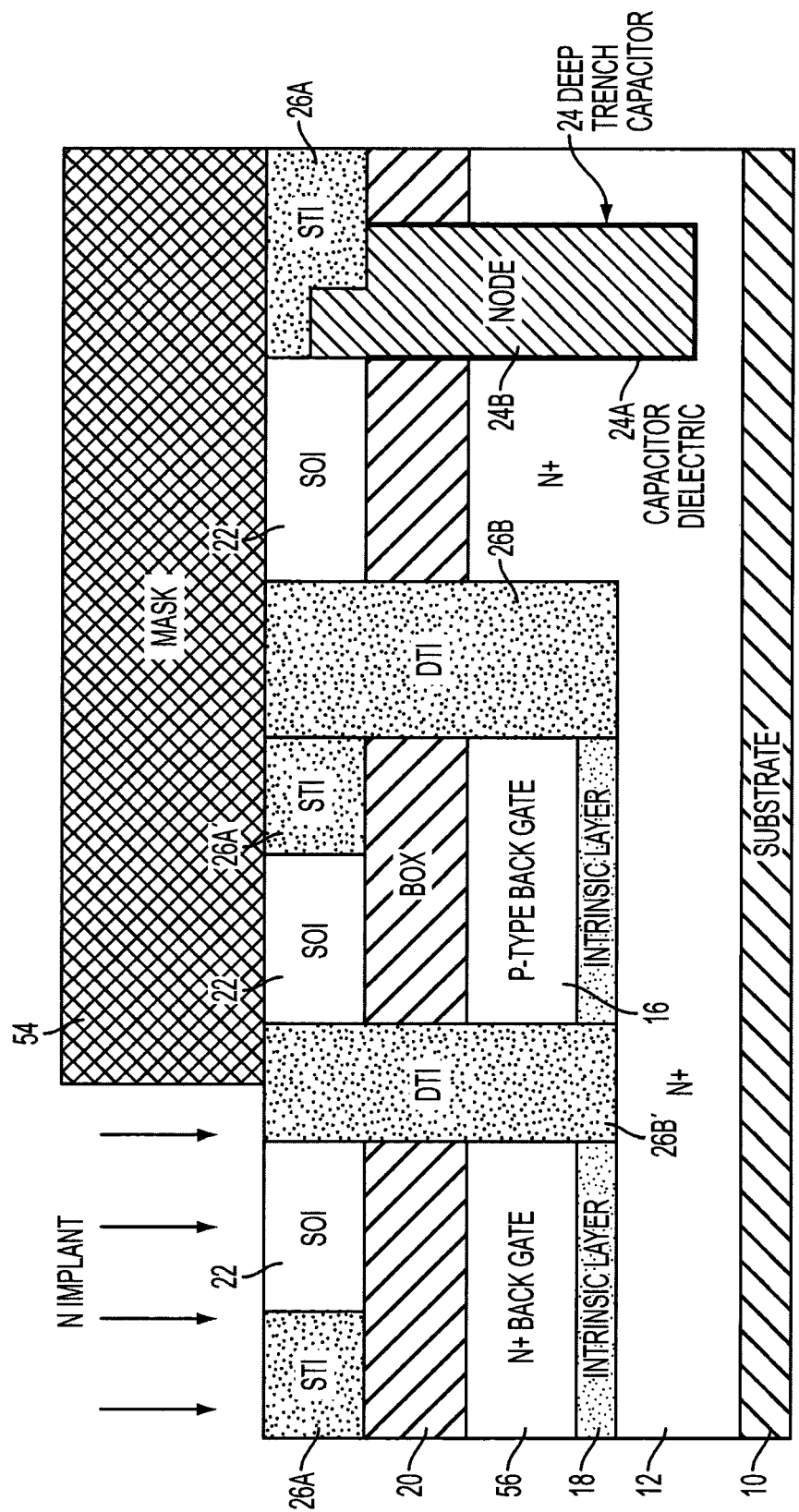

FIG. 9 shows the structure of FIG. 8 after removal of the hard mask 50 and the wafer bonding operation as in FIG. 3 to provide the BOX 20 and SOI layer 22. At this point the DTI 26B, 26B' is formed. Another mask 54 is then applied to cover what will become an eDRAM portion of the structure and the nFET portion of the structure. At this point an N-type implant is performed through the SOI 22 and BOX 20 to form an N or an N+ back gate region 56. The N-type implant can be an Arsenic or an Arsenic plus Phosphorus implant and the N or N+ bask gate region can be doped with a concentration in a range of about 1018, e.g., about 5×1018 atoms/cm3 to about 1020 atoms/cm3, as non-limiting examples of N-type implant dopant types and concentrations. The N or N+ back gate 56 can have a thickness comparable to the P back gate 16, e.g., at least about 200 nm. Note that in this embodiment there is the additional deep trench isolation 26B' formed to electrically separate the N or N+ back gate 56 from the P back gate 16. An additional STI 26A' is also formed over the P back gate 16 so that a contact can be made to the P back gate 16 in FIG. 10.

Figure 10:
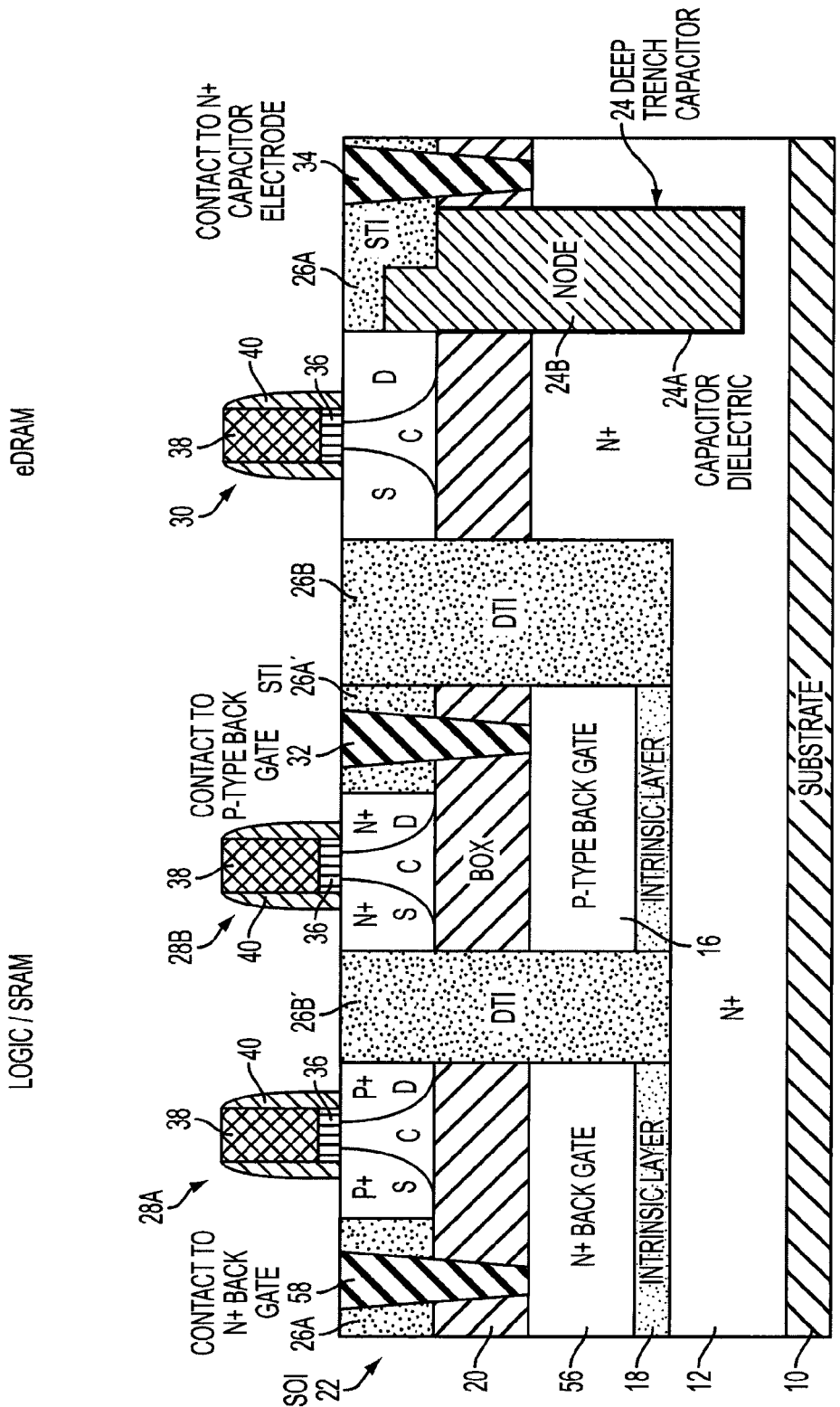

FIG. 10 shows the structure of FIG. 9 after the formation of logic/SRAM devices 28A, 28B, the eDRAM device 30, a contact 32 to the P back gate 16, a contact 58 to the N or N+ back gate 56, and a contact 34 to the N+ capacitor electrode. In this embodiment first the gate structures are patterned and defined. Then the P+, N+ junctions are formed so as to be self-aligned with the gate structures and to define sources (S) and drains (D) with intervening channel (C) regions beneath the gate structures. In this embodiment the logic/SRAM device 28A is a pFET and the logic/SRAM device 28B is an nFET. As in the embodiment of FIG. 5 each of the logic/SRAM devices 28A, 28B and the eDRAM device 30 can be assumed to include the gate structure comprised of the thin gate interface layer 36, overlying gate conductor 38 and gate spacer layer 40 (e.g., a nitride). The gate interface layer 36 can be SiO2. The gate conductor 38 can be a metal or metal system or doped polysilicon. As in FIG. 5 the exposed portion of the deep trench capacitor conductive node 24B can be seen to be electrically connected to the Drain (D) of the eDRAM device 30.

In this embodiment the P back gate 16 and the N or N+ back gate 56 can be separately biased to the same or different potentials via their respective contacts 32 and 58.

Although FIG. 10 shows the N or N+ back gate 56 under the pFET 28A and P back gate 16 under the nFET 28B, the doping types of the back gates do not depend on the overlying type of FET. That is, the N or N+ back gate 56 can be placed under the nFET 28B and/or the pFET 28A. Likewise, the P back gate 16 can be placed under the nFET 28B and/or under the pFET 28A.

Reference is now made to FIGS. 11-15 for describing a process flow in accordance with a third embodiment of this invention. As in FIGS. 1-10 the various layer thicknesses and feature dimensions are not drawn to scale. The embodiment in accordance with FIGS. 11-15 provides for two different types of back gates (one P and the other N or N+) beneath the logic/SRAM devices 28. The two back gates can be separately biased. Those layers and structures in FIGS. 11-15 that can be the same as in FIGS. 1-10 are numbered accordingly.

Figure 11:
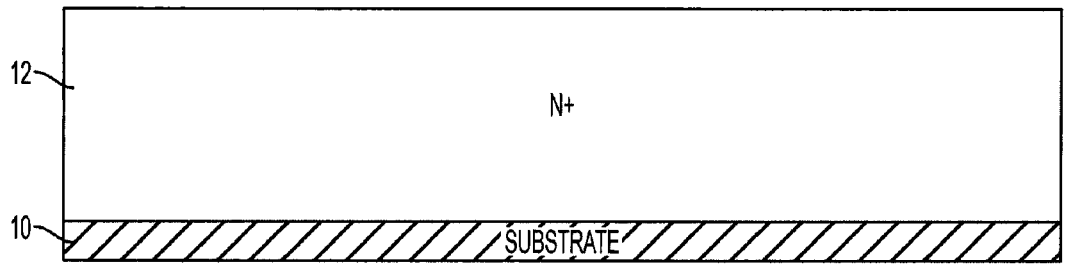
FIGS. 11-15 illustrate a process flow in accordance with a third embodiment of this invention, where.

FIG. 11 is an enlarged cross-sectional view of a structure having the semiconductor substrate 10 of any desired thickness. The substrate 10 could be a Si substrate. The N+ semiconductor layer 12 is formed in or to overlie an upper portion of the substrate 10. The N+ semiconductor layer 12 can have a dopant concentration (e.g., an As concentration) on the order of about 1020 atoms/cm3. The N+ semiconductor layer 12 could be formed by, as non-limiting examples, epitaxial growth of an in situ N+ doped Si layer, or by deposition of Si followed by a doping technique such as implantation, solid phase diffusion or gas phase diffusion, as three non-limiting examples of doping techniques.

Figure 12:
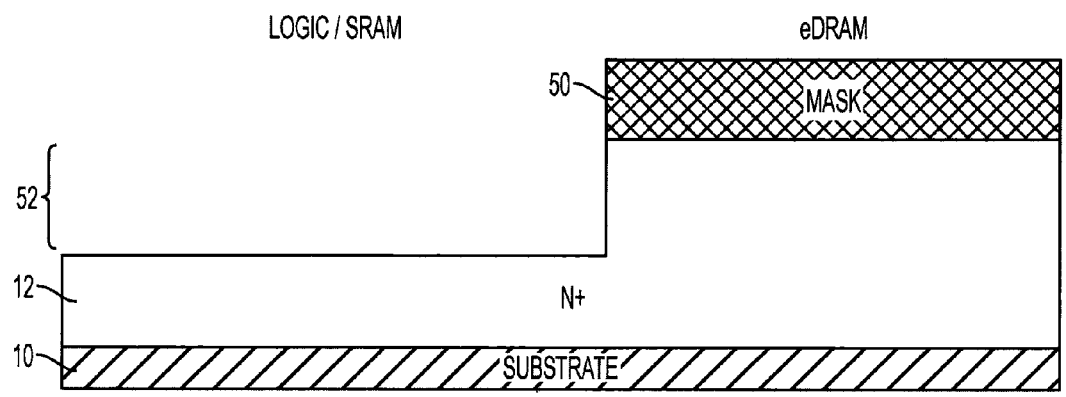

FIG. 11 shows the structure of FIG. 12 after application of a hard mask 50 over what will become the eDRAM portion of the structure, followed by removal of a portion of the N+ layer 12 to form a recessed region 52. A reactive ion etch (RIE) process is one suitable technique to form the recess 52 using an etch chemistry that is selective to Si (e.g., CF4). The depth of the recess 52 is sufficient to accommodate the thickness of the intrinsic layer (if used) and the thickness of the P back gate region (e.g., at least about 200 nm).

Figure 13:
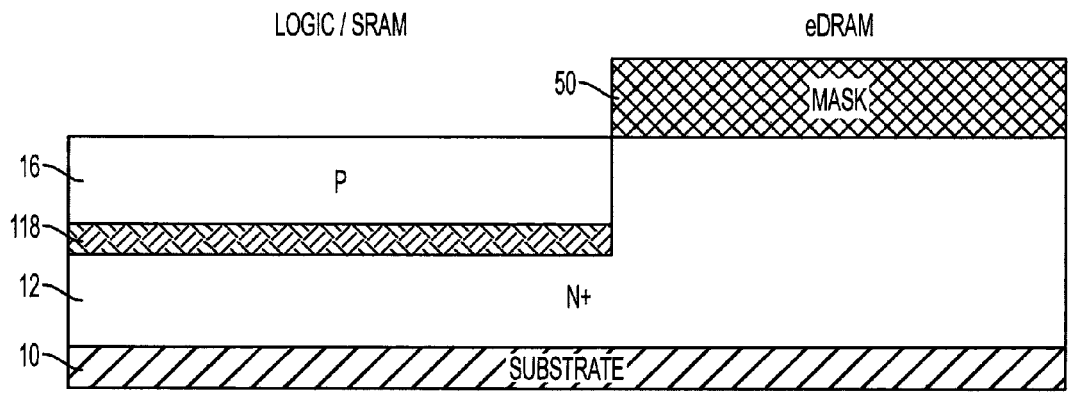

FIG. 13 shows the structure of FIG. 12 after forming the P back gate 16 by epitaxial growth within the unmasked recess 52. A buffer layer 118 can be grown before growing P-type doped layer 16. The buffer layer 118 may be epitaxially grown or deposited on the N+ layer 12. The buffer layer 118 includes a material such as, for example Si:C carbon (C) and is formed to a thickness of approximately 10-60 nm. The Si:C material includes carbon atoms arranged in substitutional regions of the Si lattice. The buffer layer may include any elemental or compound semiconductor materials that retard the diffusion of n-type dopants. The buffer layer 118 may be formed by, for example, an epitaxial growth process that grows semiconductor material on a deposition surface of semiconductor material, in which the semiconductor material being grown has the same crystalline characteristics as the semiconductor material of the deposition surface. Epitaxy may include the formation of a layer on a crystalline surface, with the layer having the same symmetry and crystalline orientation as the crystalline surface. A single crystal lattice structure often carries across an interface. In epitaxy, a single crystal or monocrystalline material forms a platform onto which another single crystal material with matching crystalline characteristics is deposited by one of several techniques. As non-limiting examples, such techniques include: ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), plasma-enhanced chemical vapor deposition (PECVD), and molecular beam epitaxy (MBE).

The term "Si:C" or "carbon-doped silicon" as used herein refers to silicon having substitutional carbon atoms located therein. The substitutional carbon atoms and the silicon atoms form a silicon-carbon alloy, which is a semiconductor material. In an alternate embodiment, the in-situ doped semiconductor material 21 is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from approximately 1% to 2%.

The buffer layer 118 aids in reducing junction leakage between the P back gate 16 and N+ layer 12. As in the embodiments of FIGS. 1-10 the thickness of the P back gate layer 16 can be at least about 200 nm. As in the embodiments of FIGS. 1-10 the dopant concentration (e.g., a Boron (B) or Difluoroborane (BF2) or an Indium (In) concentration) can be on the order of about $10^{18}$ atoms/cm3, such as a dopant concentration of about $5 \times 10^{18}$ atoms/cm3.

Figure 14:
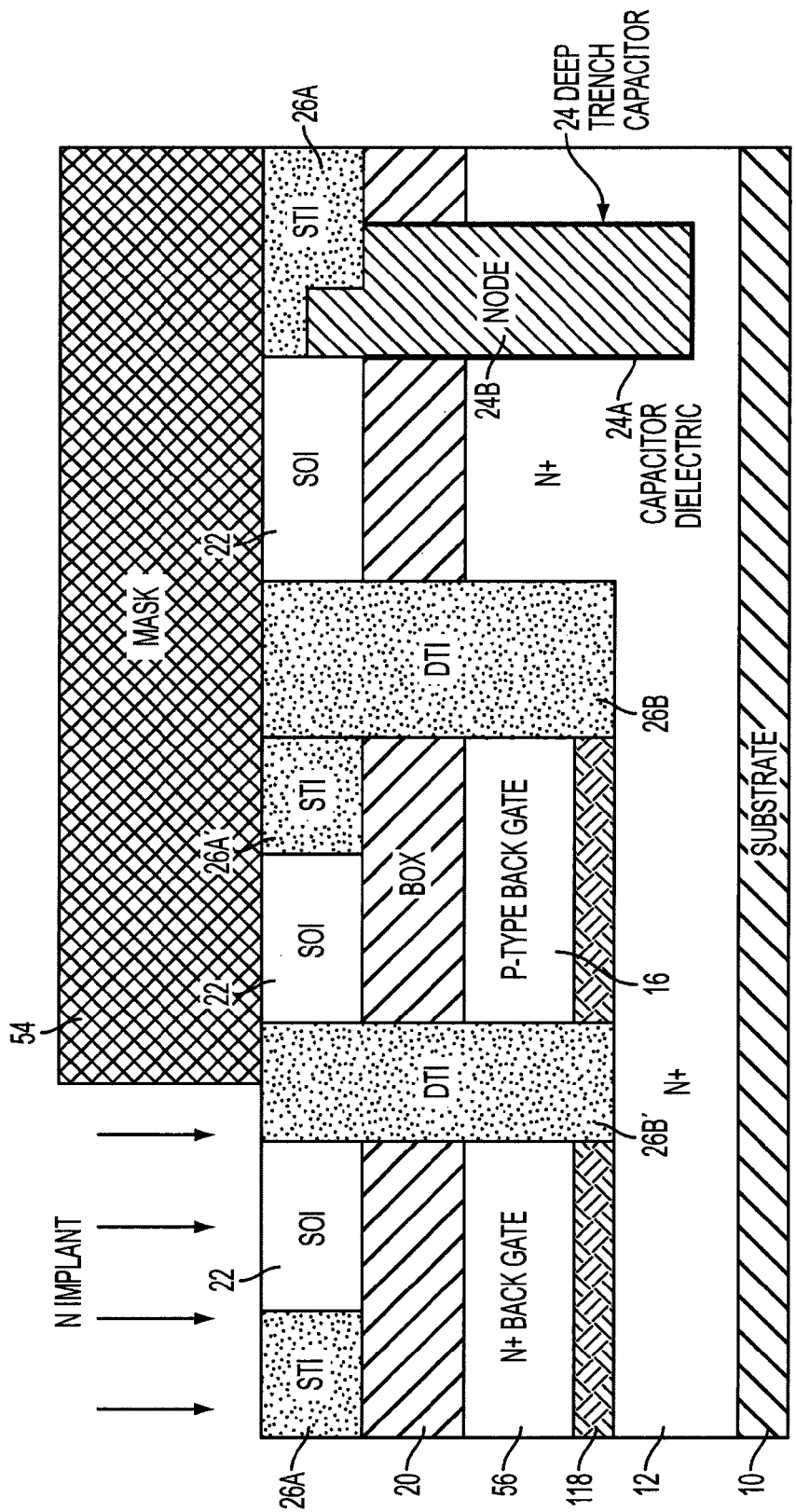

FIG. 14 shows the structure of FIG. 13 after removal of the hard mask 50 and the wafer bonding operation as in FIG. 3 to provide the BOX 20 and SOI layer 22. At this point the DTI 26B, 26B' is formed. Another mask 54 is then applied to cover what will become an eDRAM portion of the structure and the nFET portion of the structure. At this point an N-type implant is performed through the SOI 22 and BOX 20 to form an N or an N+ back gate region 56. The N-type implant can be an Arsenic or an Arsenic plus Phosphorus implant and the N or N+ bask gate region can be doped with a concentration in a range of about $10^{18}$, e.g., about $5 \times 10^{18}$ atoms/cm3 to about $10^{20}$ atoms/cm3, as non-limiting examples of N-type implant dopant types and concentrations. The N or N+ back gate 56 can have a thickness comparable to the P back gate 16, e.g., at least about 200 nm. Note that in this embodiment there is the additional deep trench isolation 26B' formed to electrically separate the N or N+ back gate 56 from the P back gate 16. An additional STI 26A' is also formed over the P back gate 16 so that a contact can be made to the P back gate 16 in FIG. 15.

Figure 15:
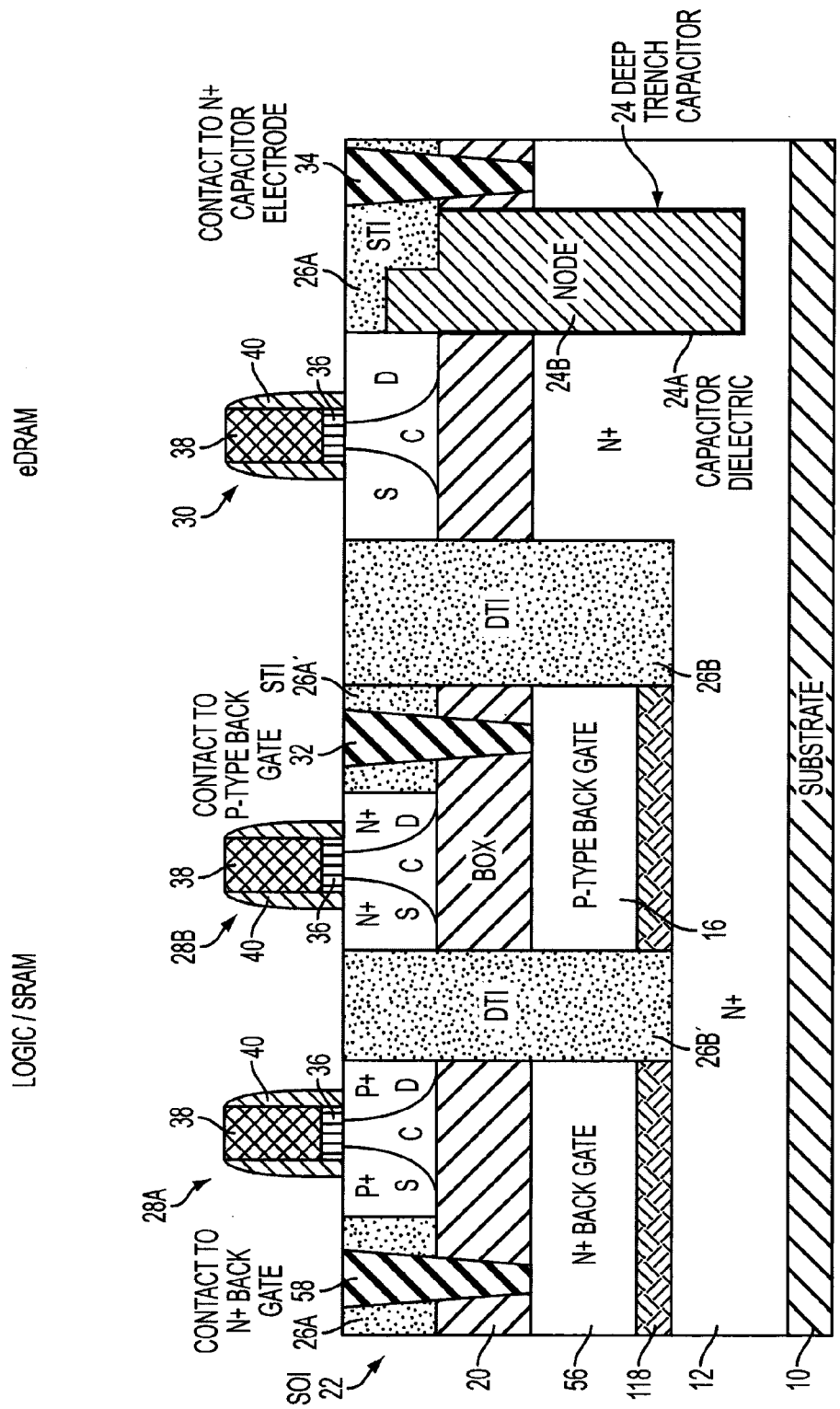

FIG. 15 shows the structure of FIG. 14 after the formation of logic/SRAM devices 28A, 28B, the eDRAM device 30, a contact 32 to the P back gate 16, a contact 58 to the N or N+ back gate 56, and a contact 34 to the N+ capacitor electrode. In this embodiment first the gate structures are patterned and defined. Then the P+, N+ junctions are formed so as to be self-aligned with the gate structures and to define sources (S) and drains (D) with intervening channel (C) regions beneath the gate structures. In this embodiment the logic/SRAM device 28A is a pFET and the logic/SRAM device 28B is an nFET. As in the embodiment of FIG. 5 each of the logic/SRAM devices 28A, 28B and the eDRAM device 30 can be assumed to include the gate structure comprised of the thin gate interface layer 36, overlying gate conductor 38 and gate spacer layer 40 (e.g., a nitride). The gate interface layer 36 can be SiO2. The gate conductor 38 can be a metal or metal system or doped polysilicon. As in FIG. 5 the exposed portion of the deep trench capacitor conductive node 24B can be seen to be electrically connected to the Drain (D) of the eDRAM device 30.

In this embodiment the P back gate 16 and the N or N+ back gate 56 can be separately biased to the same or different potentials via their respective contacts 32 and 58.

Although FIG. 15 shows the N or N+ back gate 56 under the pFET 28A and P back gate 16 under the nFET 28B, the doping types of the back gates do not depend on the overlying type of FET. That is, the N or N+ back gate 56 can be placed under the nFET 28B and/or the pFET 28A. Likewise, the P back gate 16 can be placed under the nFET 28B and/or under the pFET 28A.

After forming the structures shown in the embodiments of FIGS. 5, 10 and 15, conventional CMOS processing can be performed to complete the devices, such as, by siliciding S/Ds and gate conductors and depositing appropriate contact area (CA) metallization.

The buffer layer 118 is operative to provide a protective buffer between the N+ layer 12 and the P-type doped layer 16 and the N+ back gate region 56. In this regard, the fabrication of the deep trench capacitor conductive node 24B and the logic/SRAM devices 28A, 28B includes a variety of processes that may result in the undesirable diffusion of n-type dopants from the N+ layer 12 into the P-type doped layer 16 and the N+ back gate region 56. For example, thermal annealing processes may affect such diffusion. The diffusion would undesirably affect the dopant concentration in the P-type doped layer 16, which is lightly doped with p-type dopants. As discussed above, the buffer layer 118 includes a Si:C material. The Si:C material includes carbon atoms arranged in substitutional regions of the Si lattice that substantially impede the diffusion of n-type dopants through the buffer layer 118 and into the P-type doped layer 16 and the N+ back gate region 56. Thus, the dopant concentration of the P-type doped layer 16 and the N+ back gate region 56 may be maintained through the device fabrication process without undesirable diffusion of n-type dopants from the N+ layer 12.

Figure 16:
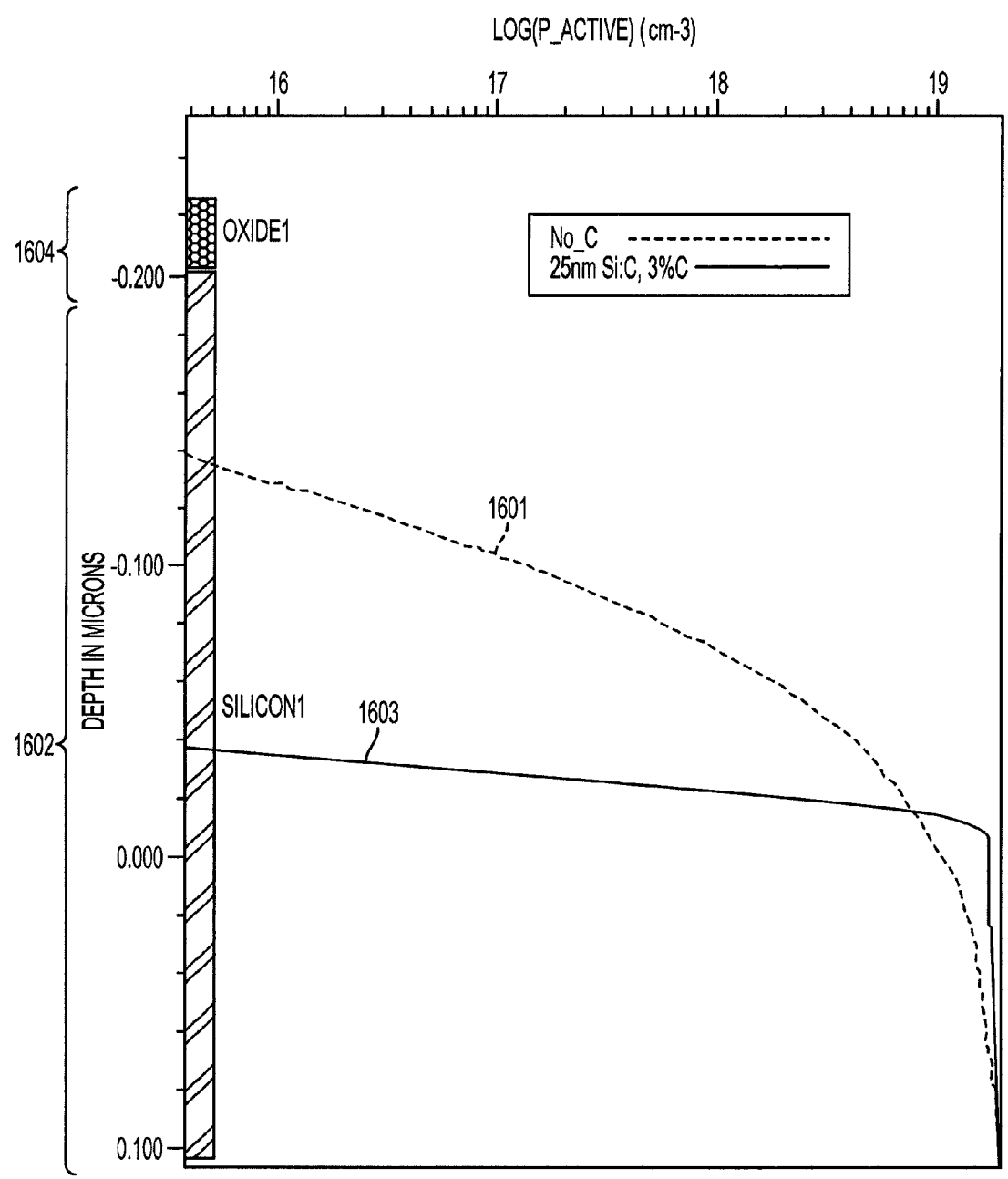
FIG. 16 illustrates a graph representing simulated test results for the diffusion of n-type dopants into a semiconductor layer.

FIG. 16 illustrates a graph representing simulated test results for the diffusion of n-type dopants into the P-type doped layer 16 (of FIG. 14). In this regard, the vertical axis illustrates a depth of P-type doped layer 16 in the region 1602 where the region 1604 illustrates the relative location of a BOX layer. The horizontal axis represents a concentration of n-type dopants. The line 1601 illustrates the concentration of n-type dopants versus depth for a substrate that does not include a buffer layer 118 due to diffusion. The line 1603 illustrates the concentration of n-type dopants versus depth for a substrate that does include a buffer layer 118. The lines 1601 and 1603, where a simulated substrate without the buffer layer has a higher concentration of n-type dopants at a lower depth indicating diffusion of the n-type dopants, and the simulated substrate that includes the buffer layer exhibits less diffusion of the n-type dopants, illustrates the effectiveness of the buffer layer in substantially reducing the diffusion of n-type dopants through the buffer layer.

The processes described herein may be used on common variants of FET devices including, e.g., FET devices with multi-fingered FIN and/or gate structures, FET devices of varying gate width and length, as well as ring oscillator devices. Moreover, the transistor devices can be connected to metalized pads or other devices by conventional ultra-large-scale integration (ULSI) metallization and lithographic techniques.

It is to be understood that in addition to fabricating transistor device contacts as discussed above, further aspects of the present invention include methods to form contacts for other devices or otherwise constructing integrated circuits with various analog and digital circuitry. In particular, integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A method to fabricate an integrated circuit comprising field effect transistors (FETs) at least some of which comprise a part of random access memory (RAM) and logic devices, comprising:
    providing a substrate having an N+ type layer;
    forming a buffer layer on a portion of the N+ type layer;
    forming a P type region on the buffer layer, the P type region having a thickness that is disposed within the N+ type layer;
    forming an insulator layer overlying the N+ type layer having a silicon layer overlying the insulator layer;
    forming a first deep trench isolation structure extending through the silicon layer, the insulator layer and the buffer layer, and into the N+ type layer to a depth that is greater than a depth at which the P type region is disposed, the first deep trench isolation structure abutting a first edge of the P type region;
    forming a dynamic RAM FET in the silicon layer connected with a conductive node of a trench capacitor that is formed to extend into the N+ type layer, the N+ type layer being a plate electrode of the trench capacitor;
    forming a first logic/static RAM FET in the silicon layer above the P type region, the P type region functional as a P-type back gate of the first logic/static RAM FET; and
    forming a first contact through the silicon layer and the insulator layer to electrically connect to the N+ type layer and a second contact through the silicon layer and the insulator layer to electrically connect to the P type region.

2. The method as in claim 1, further comprising forming a second deep trench isolation structure to extend through the silicon layer, the insulator layer, and the buffer layer, and into the N+ type layer to a depth that is greater than a depth at which the P type region is disposed, the second deep trench isolation structure abutting a second edge of the P type region.

3. The method as in claim 1, wherein the buffer layer includes an Si:C material.

4. The method as in claim 1, where forming the insulator layer overlying the N+ type layer having the silicon layer overlying the insulator layer comprises a wafer bonding operation.

5. The method as in claim 1, where forming the P type region comprises implanting the P-type region.

6. A method to fabricate an integrated circuit comprising field effect transistors (FETs) at least some of which comprise a part of random access memory (RAM) and logic devices, comprising:
    providing a substrate having an N+ type layer;
    forming a buffer layer on the N+ type layer;
    forming a P type region on the buffer layer, the P type region having a thickness that is disposed within the N+ type layer;
    forming an insulator layer overlying the N+ type layer having a silicon layer overlying the insulator layer;
    forming a first deep trench isolation structure extending through the silicon layer, the insulator layer and into the N+ type layer to a depth that is greater than a depth at which the P type region is disposed, the first deep trench isolation structure abutting a first edge of the P type region and forming a second deep trench isolation structure extending through the silicon layer, the insulator layer and into the N+ type layer to a depth that is greater than a depth at which the P type region is disposed, the second deep trench isolation structure abutting a second edge of the P type region opposite the first edge;

forming an N or N+ type region in the P type region as an N or N+ type layer having a thickness and disposed adjacent to and abutting the second deep trench isolation structure;

forming a dynamic RAM FET in the silicon layer connected with a conductive node of a trench capacitor that is formed to extend into the N+ type layer, the N+ type layer being a plate electrode of the trench capacitor, forming a first logic/static RAM FET in the silicon layer above the P type region, the P type region functional as a P-type back gate of the first logic/static RAM FET, and forming a second logic/static RAM FET in the silicon layer above the N or N+ type region, the N or N+ type region functional as an N-type back gate of the second logic/static RAM FET; and forming a first contact through the silicon layer and the insulator layer to electrically connect to the N+ type layer, a second contact through the silicon layer and the insulator layer to electrically connect to the P type region, and a third contact through the silicon layer and the insulator layer and electrically connecting to the N or N+ type region.

7. The method as in claim 6, wherein the buffer layer includes an Si:C material.

8. The method as in claim 6, where one of the first and the second logic/static RAM FETs is an N-type FET, and where the other one of the first and the second logic/static RAM FETs is a P-type FET.

9. The method as in claim 6, where forming the buffer layer comprises removing a portion of the N+ type layer to form a recess and epitaxially growing the buffer layer in the recess, wherein forming the P-type region includes epitaxially growing the P-type region in the recess, and where forming the insulator layer overlying the N+ type layer having the silicon layer overlying the insulator layer comprises a wafer bonding operation that bonds a wafer over the N+ type layer and over the epitaxially grown P-type region.

* * * * *